United States Patent
Kuchiishi et al.

(10) Patent No.: US 6,809,933 B2
(45) Date of Patent: Oct. 26, 2004

(54) PRINTED CIRCUIT BOARD HOLDING STRUCTURE

(75) Inventors: Koji Kuchiishi, Kawasaki (JP); Toshihiro Higuchi, Kawasaki (JP); Hideo Haga, Yokohama (JP); Yasunobu Ikeda, Yokohama (JP)

(73) Assignee: Matsushita Electric Industrial Eo., Ltd., Osaka (JP)

( * ) Notice: Subject to any disclaimer, the term of this patent is extended or adjusted under 35 U.S.C. 154(b) by 0 days.

(21) Appl. No.: 09/980,239

(22) PCT Filed: Apr. 3, 2001

(86) PCT No.: PCT/JP01/02893

§ 371 (c)(1), (2), (4) Date: Jan. 28, 2002

(87) PCT Pub. No.: WO01/76339

PCT Pub. Date: Oct. 11, 2001

(65) Prior Publication Data

US 2003/0007333 A1 Jan. 9, 2003

(30) Foreign Application Priority Data

Apr. 4, 2000 (JP) ........................ 2000-102564

(51) Int. Cl.[7] ................................. H05K 5/00
(52) U.S. Cl. ....................... 361/752; 361/801
(58) Field of Search ............... 361/752, 753, 361/756, 759, 801, 802, 807; 403/29, 409.1

(56) References Cited

U.S. PATENT DOCUMENTS

| | | | |
|---|---|---|---|
| 4,688,149 A | * 8/1987 | Inoue et al. | 361/752 |
| 4,821,149 A | 4/1989 | Belanger, Jr. | |
| 5,144,533 A | 9/1992 | Annett | |
| 5,154,631 A | * 10/1992 | Belanger, Jr. | 211/141.17 |
| 5,229,923 A | 7/1993 | Long et al. | |
| 5,415,573 A | * 5/1995 | Chen et al. | 439/876 |
| 5,581,446 A | * 12/1996 | Sanpei et al. | 206/324 |
| 5,689,405 A | * 11/1997 | Bethurum | 361/737 |
| 5,704,489 A | * 1/1998 | Smith | 209/2 |
| 5,755,585 A | * 5/1998 | Cheng et al. | 439/326 |
| 5,961,338 A | * 10/1999 | Wu et al. | 439/326 |
| 6,324,076 B1 | * 11/2001 | Gerrits et al. | 361/737 |
| 2001/0005655 A1 | 6/2001 | Cabane et al. | |

FOREIGN PATENT DOCUMENTS

DE 75 26 707 12/1975
FR 2803110 A1 * 6/2001 ............ G06K/7/00

* cited by examiner

Primary Examiner—David Martin
Assistant Examiner—Thanh S. Phan
(74) Attorney, Agent, or Firm—Pearne & Gordon LLP

(57) ABSTRACT

First of all, a sub-PCB (6) is fixedly put on a surface of a chassis (5) as shown in an arrow I. At this time, a taper face (9a) of a guide rib (9) guides a fixed position of the sub-PCB (6) in a transverse direction. Next, the sub-PCB (6) is slid forward as shown in an arrow II. A front end of the sub-PCB (6) is led into a taper face (8b) of a fixed click (8) and is guided downward, and gets into the underside of the click and stops in a position of an abutting face (8c).

7 Claims, 5 Drawing Sheets

PRINTED CIRCUIT BOARD HOLDING STRUCTURE

This application claims the benefit of International Application Number PCT/JP01/02893, which was published in English on Oct. 11, 2001.

TECHNICAL FIELD

The present invention relates to a printed circuit board holding structure for attaching a printed circuit board (PCB, hereinafter) into a housing, and more particularly to a PCB holding structure capable of reducing a thickness of the housing.

BACKGROUND ART

Conventionally, there has been a PCB holding structure for attaching a PCB into a housing as shown in FIGS. 4 and 5. The PCB holding structure serves to attach a sub-PCB to a chassis provided in a casing of a mobile telephone. Description will be given below with reference to FIGS. 4 and 5.

As shown in FIG. 4, the mobile telephone comprises a first casing 21 and a second casing 22. The first casing 21 is provided on the back side and accommodates a chassis 25, a main PCB 24 held on the lower side of the chassis 25, a sub-PCB 26 held on the upper side of the chassis 25, and an LCD module 27 held on the upper side of the chassis 25.

The second casing 22 is provided on the surface side to cover the upper surface of the first casing 21 and has an opening formed in a position opposed to the LCD module 27. A transparent window 23 is fixed over the opening. In the following description, an upward direction during the use of the mobile telephone is set to a forward direction of the casing.

On both side ends in a place of the chassis 25 where the sub-PCB 26 is to be attached, a pair of movable clicks 28 and 29 are provided in a longitudinal direction with a predetermined space, respectively. In the movable clicks 28 and 29, taper faces formed on upper ends are opposed to taper faces of the movable clicks 28 and 29 provided on opposite side ends. Moreover, the space between the opposed taper faces is set to be slightly smaller than a lateral width of the sub-PCB 26 and elastic deformation can be carried out in such a direction that the space is increased.

When attaching the sub-PCB 26 onto the chassis 25, the taper faces of the movable clicks 28 and 29 are pressed downward from the lower surfaces in both side edge portions of the sub-PCB 26 as shown in FIG. 5A. The movable clicks 28 and 29 are pressed against the sub-PCB 26 and are thereby deformed elastically in such a direction that the lateral space is increased, and are then returned to an original state after the sub-PCB 26 is mounted on the upper surface of the chassis 25. Thus, the sub-PCB 26 can be held by the movable clicks 28 and 29.

In, the conventional PCB holding structure described above, the sub-PCB 26 is guided and held through the movable clicks 28 and 29. As shown in FIG. 5B, therefore, it is necessary to have a holding width a in addition to a guide width b for guiding the sub-PCB 26 to a predetermined board position. In other words, a width of (a+b) is required for the taper fate and a height of (d1+d2) is required for the taper face. As a result, the taper face of the movable click is increased upward. Consequently, there has been a problem in that a vertical thickness of the casing is increased.

In order to solve such a problem, the invention has an object to provide a PCB holding structure capable of reducing a thickness of a casing.

DISCLOSURE OF INVENTION

The present invention provides a PCB holding structure wherein a first guide member having a taper face for guiding a PCB in a transverse direction when fixedly putting the PCB on an attachment object member and a second guide member having at a taper face for downward guiding the PCB put fixedly when sliding the PCB in a longitudinal direction are provided on the attachment object member. By such a structure, it is possible to set the heights of the first and second guide members to be smaller than a height of a conventional click. Therefore, it is possible to reduce a thickness of an apparatus casing having the PCB provided therein.

BEST MODE FOR CARRYING OUT THE INVENTION

An embodiment of the invention will be described below in detail with reference to the drawings.

Figure 1:
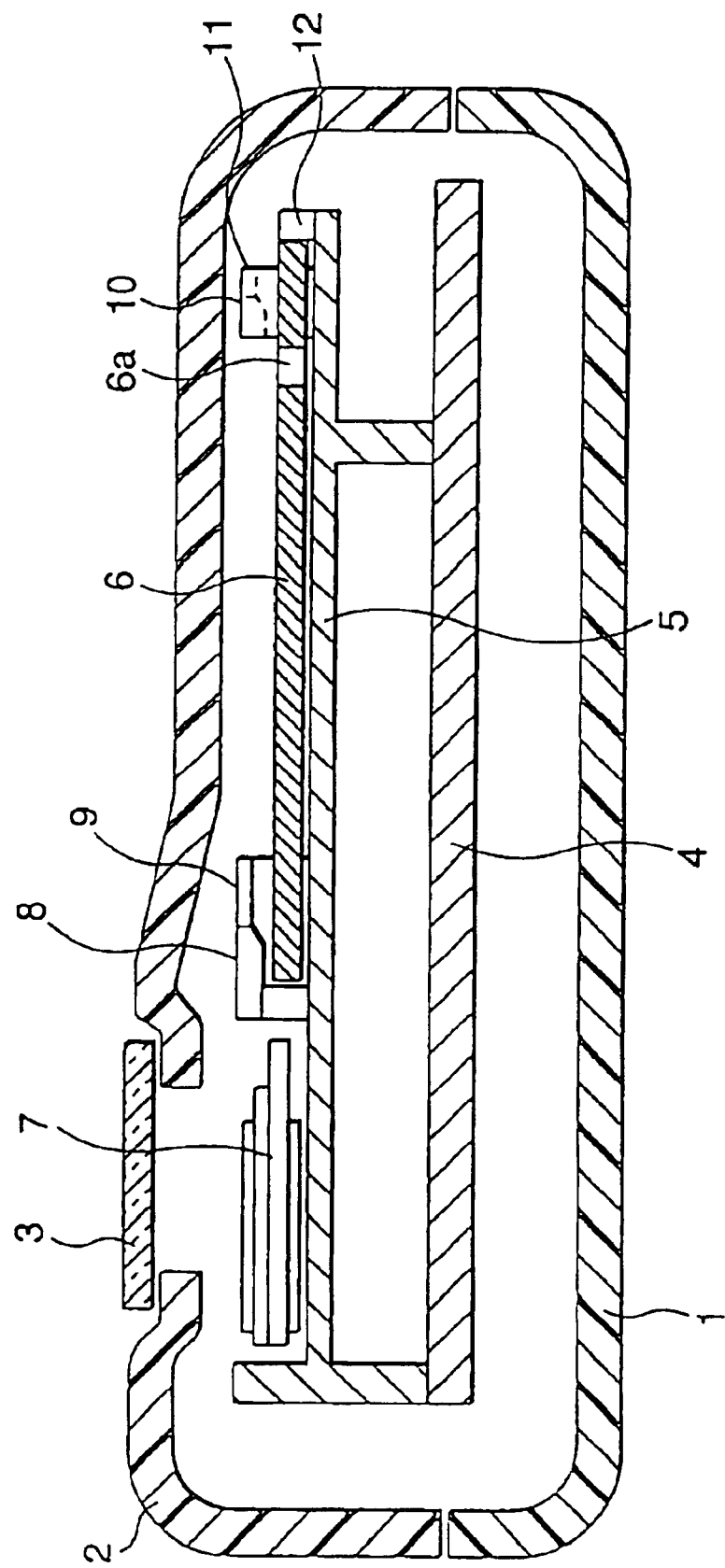
FIG. 1 is a view showing a PCB holding structure according to an embodiment of the invention.

FIG. 1 is a view showing a PCB holding structure according to an embodiment of the invention. In the embodiment, there is provided a PCB holding structure in which a sub-PCB is attached to a chassis provided in a casing of a mobile telephone.

As shown in FIG. 1, the mobile telephone comprises a first casing 1 and a second casing 2. The first casing 1 is provided on the back side and accommodates a chassis 5, a main PCB 4 held on the lower side of the chassis 5, a sub-PCB 6 attached onto the chassis 5, and an LCD module 7 held on the upper side of the chassis 5. The second casing 2 is provided on the surface side to cover the upper surface of the first casing 1 and has an opening formed in a position opposed to the LCD module 7. A transparent window 3 is fixed over the opening.

The chassis 5 and the sub-PCB 6 are formed of a synthetic resin having elasticity. In the chassis 5, a fixed click 8 and a guide rib 9 are provided in the front edge parts of both side edge portions in a place where the sub-PCB 6 is to be attached, and a fixed click 10 and a guide rib 11 are provided in the rear edge parts of the both side edge portions. In the chassis 5, moreover, a stopper 12 is provided in the rear edge part of the place where the sub-PCB 6 is to be attached. Furthermore, a notch 6a for causing the fixed click 10 to penetrate therethrough is formed in the rear portion of the sub-PCB 6.

Figure 2A:
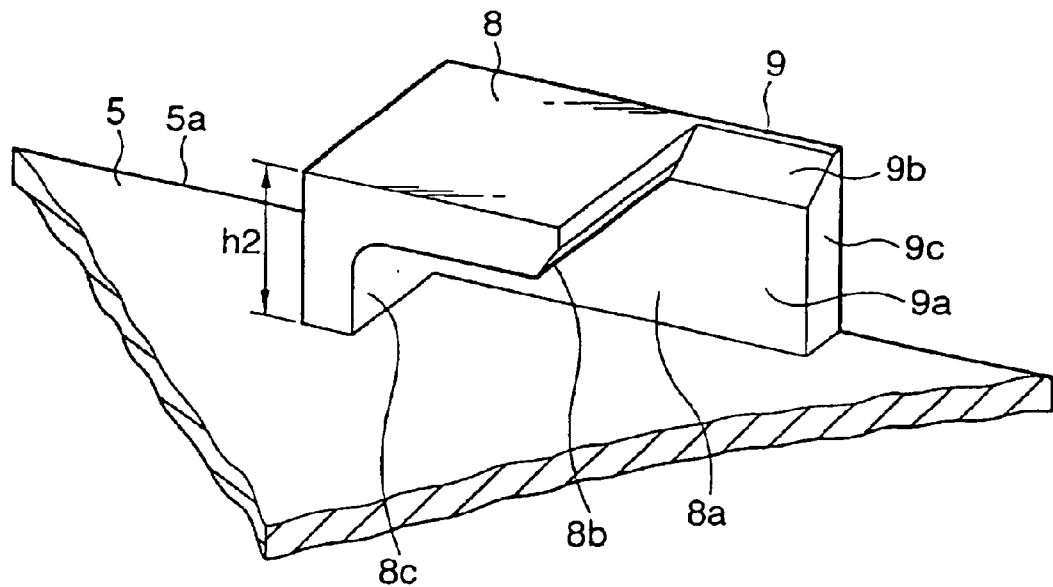
FIGS. 2A and 2B are views illustrating the structure of a fixed click and a guide rib in FIG. 1 and the procedure for attaching a sub-PCB.
Figure 5A:
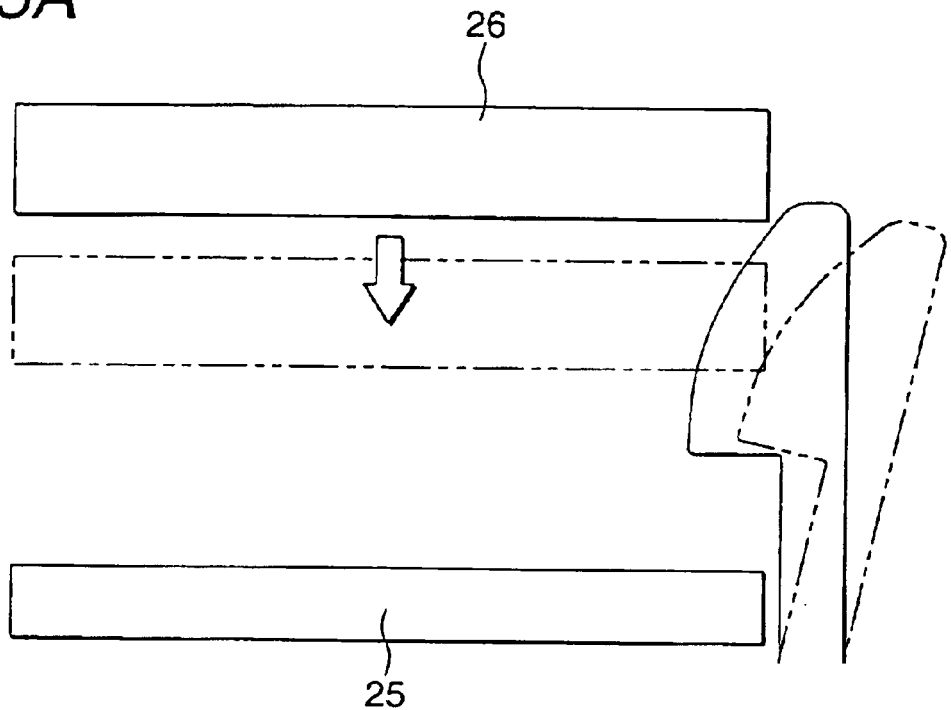
FIGS. 5A and 5B are views illustrating the procedure for attaching a conventional PCB to a chassis.
Figure 5B:
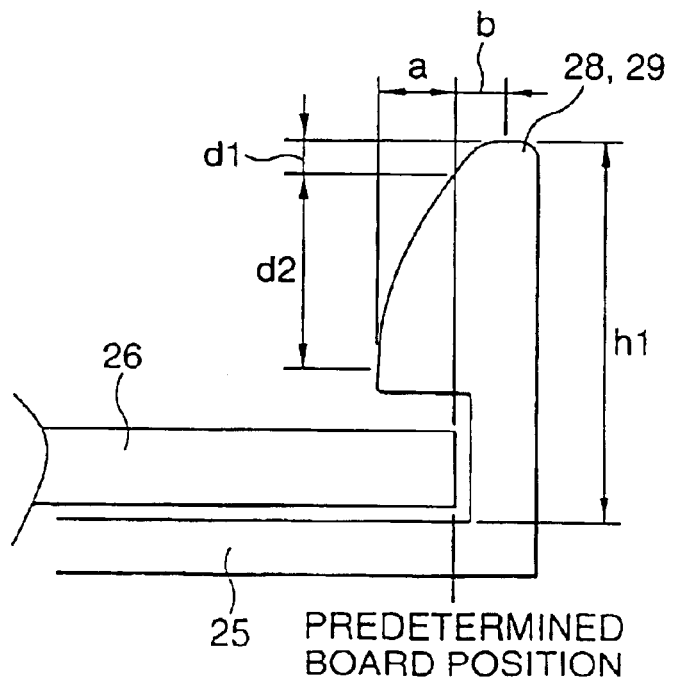

As shown in FIG. 2A, the fixed click 8 is erected on the side edge part of the surface of the chassis 5 in a sectional shape obtained by rotating an almost L shape by 90 degrees rightwards. There is provided a guide face 8a to be an internal wall surface parallel with a side edge 5a of the chassis 5. Moreover, a taper face 8b to have a distance from the surface of the chassis 5 decreased gradually is formed inwardly from the tip portion of the click. Furthermore, an abutting face 8c which is perpendicular to the surface of the chassis 5 and is orthogonal to the side edge 5a of the chassis 5 is provided in the base portion of the click. Moreover, the guide rib 9 is erected to have an almost prismatic shape in the side edge part of the surface of the chassis 5 as shown in FIG. 2A. A taper face 9b turned toward the inside of the side edge 5a of the chassis 5 is formed on the upper end of the guide rib 9, and furthermore, a vertical guide face 9a reaching the surface of the chassis 5 from the lower end of a taper face 9b is formed. The taper face 9b has a width equivalent to a guide width b and a height equivalent to a height d1 in FIG. 5B. The guide rib 9 is constituted integrally with the fixed click 8, and the guide face 9a and the guide face 8a form continuous surfaces without a step. The fixed click 10 has such a shape that the abutting face 8c is cut away from the fixed click 8. The guide rib 11 has the same shape as that of the guide rib 9. The stopper 12 is a projection provided upward from the rear edge of the chassis 5. The fixed click 8, the guide rib 9, the fixed click 10, the guide rib 11 and the stopper 12 are suitably formed integrally with the chassis 5.

Figure 2B:
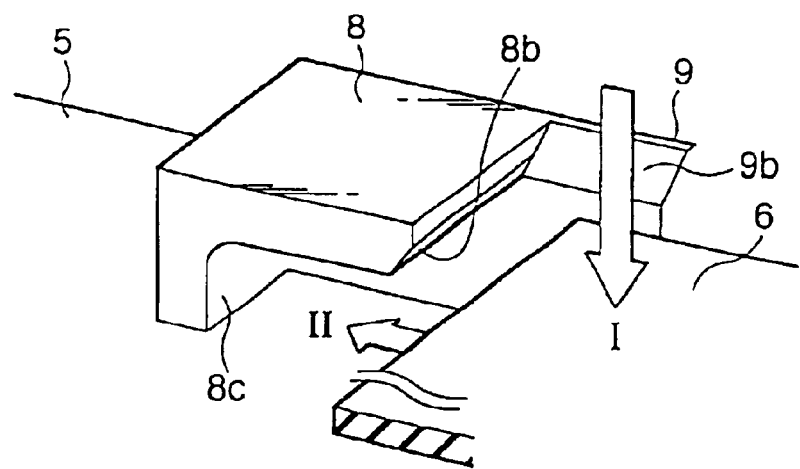

Description will be given to the procedure for attaching the sub-PCB 6 to the chassis 5 having such a structure. First of all, the sub-PCB 6 is fixedly put on the surface of the chassis 5 as shown in an arrow I of FIG. 2B. In such a state that the sub-PCB 6 is fixedly put on the surface of the chassis 5, the side end face of the front edge part of the sub-PCB 6 is in contact with the guide face 9a of the guide rib 9, the rear edge part is mounted on the stopper 12 and the notch 6a is opposed to the fixed click 10. As shown in an arrow II of FIG. 2B, next, the sub-PCB 6 is slid forward. The front end of the sub-PCB 6 is led into the taper face 8b of the fixed click 8 and is guided downward, and gets into the underside of the click. At the same time, the rear edge part of the sub-PCB 6 is also led into the taper face of the fixed click 10 and is guided downward, and gets into the underside of the click. At this time, both side ends of the front edge part of the sub-PCB 6 is guided by the guide face 9a and the guide face 8a. Then, the front end of the sub-PCB 6 abuts on the abutting face 8c so that a sliding operation is stopped and the attachment of the sub-PCB 6 is completed.

In such a state that the sub-PCB 6 is attached to the surface of the chassis 5, the front end face of the sub-PCB 6 is in contact with the contact face 8c of the fixed click 8 and the side end face thereof is in contact with the guide face 9a of the guide rib 9 and the guide face 8a of the fixed click 8. Moreover, the side end face of the rear edge part of the sub-FCB 6 is in contact with the guide face of the guide rib 11 and that of the fixed click 10, and the rear end face thereof is positioned ahead of the stopper 12. Even if the sub-PCB 6 is to be slid rearward in this state, the rear end of the sub-PCB 6 abuts on the front end of the stopper 12 so that the sliding operation is inhibited. Consequently, the sub-PCB 6 can be prevented from automatically getting out by gravitation.

When the sub-PCB 6 is to be removed, the stopper 12 is pressed downward and is thus flexed and the sub-PCB 6 is slid rearward while maintaining such a state that the rear end of the sub-PCB 6 does not abut on the front end of the stopper 12, and is then returned to the fixed state. Next, when the sub-PCB 6 is lifted upward, the chassis 5 can be removed.

Figure 3A:
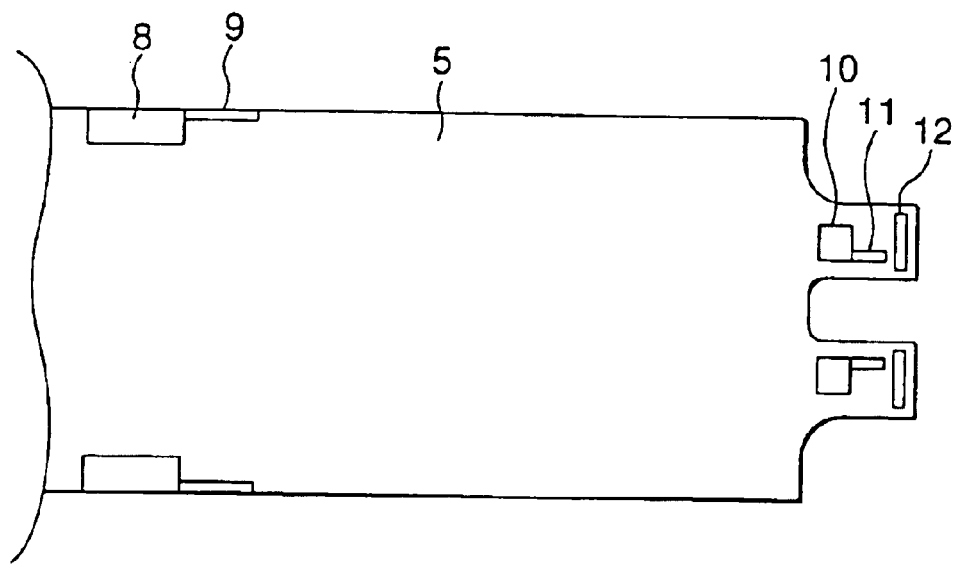
FIGS. 3A and 3B are views showing a variant of the shapes of a chassis and the sub-PCB and the positions where the fixed click, the guide rib and a stopper are to be provided.
Figure 3B:
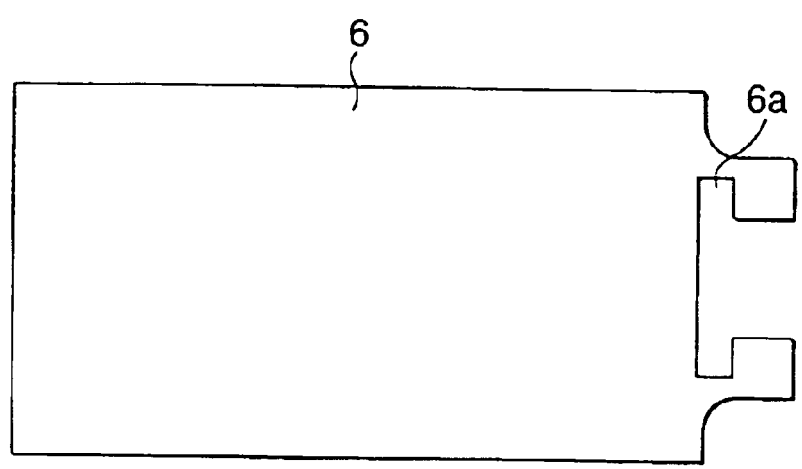
Figure 4:
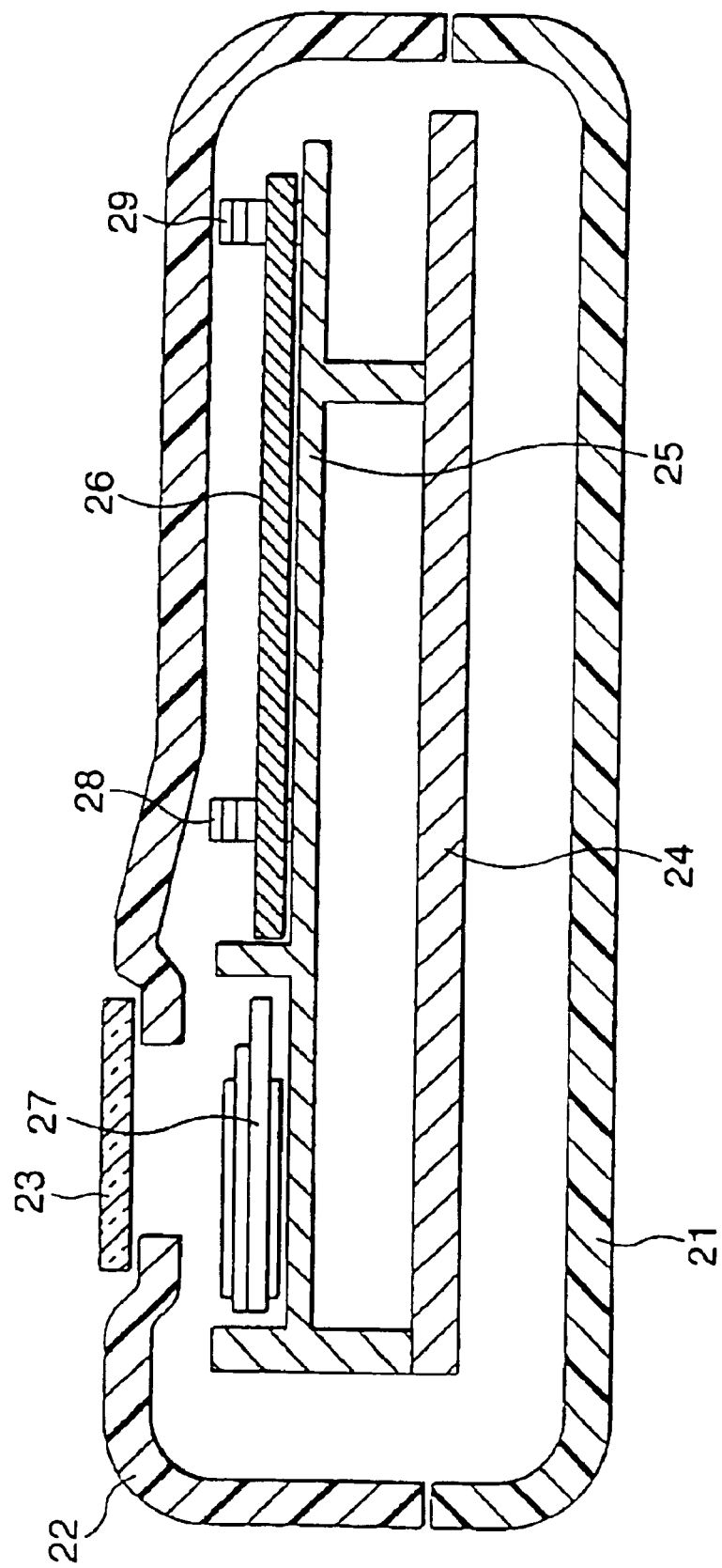
FIG. 4 is a view showing a conventional PCB holding structure.

The guide face 8a of the fixed click 8 does not need to be provided. Moreover, the predetermined positions of both side ends of the sub-PCB 6 may be widened to be positioning portions, and the sliding operation may be completed in a position where the positioning portions abut on the abutting face 9c of the guide rib 9. With such a structure, the contact face 8c does not need to be provided on the fixed click 8. To the contrary, in the case in which the abutting face 8c is provided, the contact face 9c is not required. In other words, either the contact face 8c or 9c may be provided. Furthermore, the guide face 8a may be provided on the outside of the guide face 9a. The fixed click 8 and the guide rib 9 may be provided separately. Moreover, the height of the guide rib 9 may be smaller than that of the fixed click 8. Furthermore, the shapes of the chassis 5 and the sub-PCB 6 and the positions where the fixed clicks 8 and 10, the guide ribs 9 and 11 and the stopper 12 are to be provided may be set as shown in FIG. 3.

According to the embodiment of the invention, as described above, the ribs 9 and 11 having the taper faces for guiding the sub-PCB 6 in a transverse direction when fixedly putting the sub-PCB 6 on the chassis 5 and the fixed clicks 8 and 10 having the taper faces for downward guiding the sub-PCB 6 put fixedly when forward sliding the sub-PCB 6 are provided in the side edge part of the chassis 5. A height h2 of the fixed clicks 8 and 10 can be made smaller than a height h1 of the conventional movable click. Therefore, it is possible to reduce a thickness of a casing of a mobile telephone.

INDUSTRIAL APPLICABILITY

According to the invention, as described above, it is possible to set the heights of the first and second guide members to be smaller than a height of the conventional movable click. Therefore, it is possible to reduce a thickness of an apparatus casing having the PCB provided therein.

What is claimed is:

1. A printed circuit board holding structure for attaching a printed circuit board on an attachment object member, the printed circuit board defining a longitudinal direction, the holding structure comprising:
   a chassis;
   a first guide member connected to the chassis and having a taper face for guiding the printed circuit board in the transverse direction transverse to the longitudinal direction in response to fixedly putting the printed circuit toward the chassis on the attachment object member; and
   a second stationary guide member having a taper face for guiding the printed circuit board toward the chassis in response to sliding the printed circuit board in the longitudinal direction.

2. A printed circuit board holding structure according to claim 1, wherein the second guide member has an abutting face for defining a position where a tip of the printed circuit board is to be stopped.

3. A printed circuit board holding structure according to claim 1, wherein the second guide member has a guide face for defining a position of a side end face of the printed circuit board.

4. A printed circuit board holding structure according to claim 1, further comprising an elastic stopper member for preventing the printed circuit board from going backward after the sliding is completed.

5. A printed circuit board holding structure according to claim 1, wherein the first guide member and the second guide member are constituted integrally.

6. A printed circuit board holding structure for attaching a printed circuit board on an attachment object member, comprising:
   a first guide member having a vertical guide face and a first taper face; and a second stationary guide member having a horizontal guide face and a second taper face;

wherein the first taper face is inclined at a first angle from the vertical guide face and an axis of the first angle is parallel to the horizontal guide face; and wherein the second taper face is inclined at a second angle from the horizontal guide face and an axis of the second angle is perpendicular to the vertical guide face.

7. A printed circuit board holding structure according to claim 6, further comprising a chassis having a side edge, wherein the vertical guide face extends from the chassis, wherein the second guide member is connected the chassis, and wherein the horizontal guide face is adapted for guiding the printed circuit board in a direction parallel to the side edge of the chassis.

* * * * *